United States Patent [19]

Sasaki et al.

[11] Patent Number: 4,825,209

[45] Date of Patent: Apr. 25, 1989

[54] REMOTE CONTROL APPARATUS

[75] Inventors: Hiroaki Sasaki; Junichi Ouchi; Kazuo Hasegawa, all of Furukawa, Japan

[73] Assignee: Alps Electric Co., Ltd, Japan

[21] Appl. No.: 193,214

[22] Filed: May 11, 1988

Related U.S. Application Data

[63] Continuation of Ser. No. 836,959, Mar. 6, 1986, abandoned.

[30] Foreign Application Priority Data

Mar. 6, 1985 [JP] Japan .................................. 60-44138

[51] Int. Cl.⁴ ...................... H04B 11/16; G08K 19/00
[52] U.S. Cl. ......................... 340/825.72; 340/825.37; 455/151; 455/127; 358/194.1; 341/23
[58] Field of Search ...................... 340/825.37, 825.69, 340/825.71, 825.72, 825.73, 365 VL, 365 C, 712; 455/352, 127, 151, 603, 617; 358/194.1

[56] References Cited

U.S. PATENT DOCUMENTS

| 4,521,870 | 6/1985 | Babbel et al. | 340/365 VL |
| 4,566,001 | 1/1986 | Moore et al. | 340/365 VL |
| 4,746,919 | 5/1988 | Reitmeier | 340/825.72 X |

FOREIGN PATENT DOCUMENTS

| 0120345 | 10/1984 | European Pat. Off. | 340/365 VL |
| 58-11689 | 7/1983 | Japan | 340/825.72 |
| 58-19019 | 11/1983 | Japan | 340/825.72 |

Primary Examiner—Benedict V. Safourek
Assistant Examiner—Ralph E. Smith
Attorney, Agent, or Firm—Guy W. Shoup; Paul J. Winters; Brian D. Ogonowsky

[57] ABSTRACT

A primary object of the present invention is to provide a remote control apparatus commonly usable to various devices, made in a smaller size and yet provided with no small area of the display portion for displaying operation status of the device. The invention provides a remote control apparatus using a touch panel, which is capable of sensing coordinates of a specified point for inputting the remote control command and also as a display of various images for inputting the operating command and of operation status of the remote controlled device. The invention also provides a remote control apparatus which puts a transmitting portion, receiving portion and image display control portion thereof in an enabled state for a predetermined period of time after the touch panel is pressed thereby to reduce power consumption.

3 Claims, 3 Drawing Sheets

REMOTE CONTROL APPARATUS

This is a continuation application from application Ser. No. 836,959 filed Mar. 6, 1986, now abandoned.

BACKGROUND OF THE INVENTION

1. Field of the Invention

The present invention relates to a remote control apparatus and more particularly to a remote control apparatus employing a touch panel, which is capable of sensing coordinates of a specified point, as an input device of a remote control signal as well as display means displaying thereon an image for inputting the operating command to each device remote controlled and an image which indicates operation status of the device.

2. Description of the Prior Art

A remote control apparatus is in use to control operations of various devices located remote from a user. When it is desired to control a remote device such as, for example, a video or a television set, the user can control such a set from a distance with a remote control apparatus dedicated to each set and operating the remote control apparatus by, for example, pressing switches provided thereon. Recently, however, a wide variety of devices have come to be used in general homes and others, such as television (TV), video tape recorder (VTR), compact disk (CD), video disk (VD), laser disk (LD), and audio system (AD), and the remote control apparatus have also increased in number. As a result, a problem has been produced that operations of a plurality of such remote control apparatus have become complicated and management of them has become troublesome.

There also was such a disadvantage in the conventional remote control apparatus that it was not possible to confirm with it if a remote controlled device has been put in proper operation and to check if a device is kept in a normal operating condition.

Accordingly, there have been proposed a remote control apparatus usable commonly to various devices and a remote control apparatus capable of receiving a status signal indicating the operating condition of the controlled device and making it displayed thereon.

The remote control apparatus common to various devices hitherto proposed, however, has had such disadvantages that the same must have separate keys provided thereon for each of the remote controlled devices, hence a large number of keys, and so, the remote control apparatus has become larger in size. If the remote control apparatus is restricted in size, its display portion for displaying the operating condition of a device becomes too small to be seen easily, and, furthermore, it becomes unable to make a variety of displays.

SUMMARY OF THE INVENTION

Accordingly, a primary object of the present invention is to provide a remote control apparatus commonly usable to various devices, made in a smaller size and yet provided with no small area of the display portion for displaying operation status of the device.

Another object of the invention is to provide a remote control apparatus using a touch panel, which is capable of sensing coordinates of a specified point, as means for inputting the remote control command and also as a display of various images for inputting the operating command and of operation status of the remote controlled device.

A further object of the invention is to provide a remote control apparatus which puts a transmitting portion, receiving portion and image display control portion thereof in an enabled state for a predetermined period of time after the touch panel is pressed thereby to reduce power consumption.

To attain the above mentioned objects, the remote control apparatus of the invention comprises: (1) a transmitting portion for transmitting an operating command signal to a controlled device; (2) a receiving portion for receiving a status signal indicating operation status of the controlled device; (3) an operating portion for inputting the mentioned operating command and in response to the status signal received as above for displaying the operation status of the controlled device; and (4) an image display control portion. The mentioned operating portion includes: (a) an image display device for selectively displaying a predetermined image for inputting an operating command on its display surface and also displaying there the mentioned operation status; (b) a translucent panel disposed in front of the display surface of the image display device; (c) an optical coordinate sensor for optically sensing coordinates of a specified point on the surface of the translucent panel; and (d) a switch actuated by a press on the translucent panel for enabling the transmitting portion, receiving portion, and the image display control portion for a predetermined period of time.

In using the apparatus of the invention, a predetermined operation is made so that a display of a menu appears on the display surface of the image display device for selecting therefrom the device to be remote controlled. Then, the surface of the panel is pressed at the position where the name of the device to be remote controlled is indicated. The press on the panel actuates the switch to enable the transmitting portion, receiving portion, and image display control portion for a predetermined period of time and makes, according to the selected device, an image for inputting an operating command displayed on the display surface of the image display device, an LCD, for example. If, then, the surface of the panel is pressed at the position where a specific control key is indicated, the control command is identified according to the data as to of what device the image for inputting the operating command is on display and the data about the pressed position on the translucent panel, and the identified operating command is encoded and transmitted through the transmitting portion to the side of the controlled device. If the specific device starts up upon receipt of the operating command, an operation detecting portion on the side of the controlled device detects it and transmits an operation status signal to the remote control apparatus. The receiving portion of the remote control apparatus receives the operation status signal and supplies it to the image display control portion, and the image display control portion, in response to the status signal, makes the operation status displayed on the image display device in, for example, reversed displaying of the portion of the control key which was operated, underlining the control key, or making a specific display in a predetermined display region.

The user can see the operation status display by means of the translucent panel and confirm that the remote controlled device has been properly put in operation as well as the operating condition of the device.

By arranging an image to be displayed for inputting an operating command according to each device, remote controlling of the device becomes possible. Therefore, there is no need for making the remote control apparatus larger in size and yet the area of the display region need not be restricted.

DESCRIPTION OF THE PREFERRED EMBODIMENT

Figure 1:
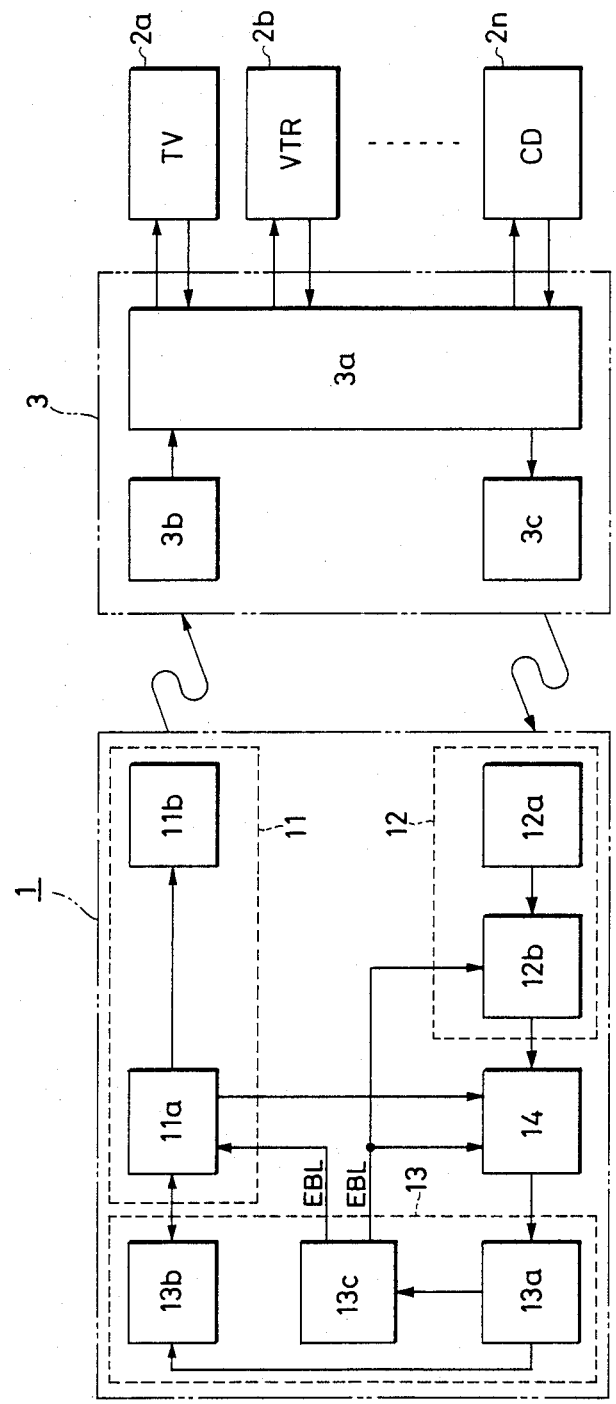
FIG. 1 is a block diagram of a system including a remote control apparatus of the present invention.
Figure 2A:
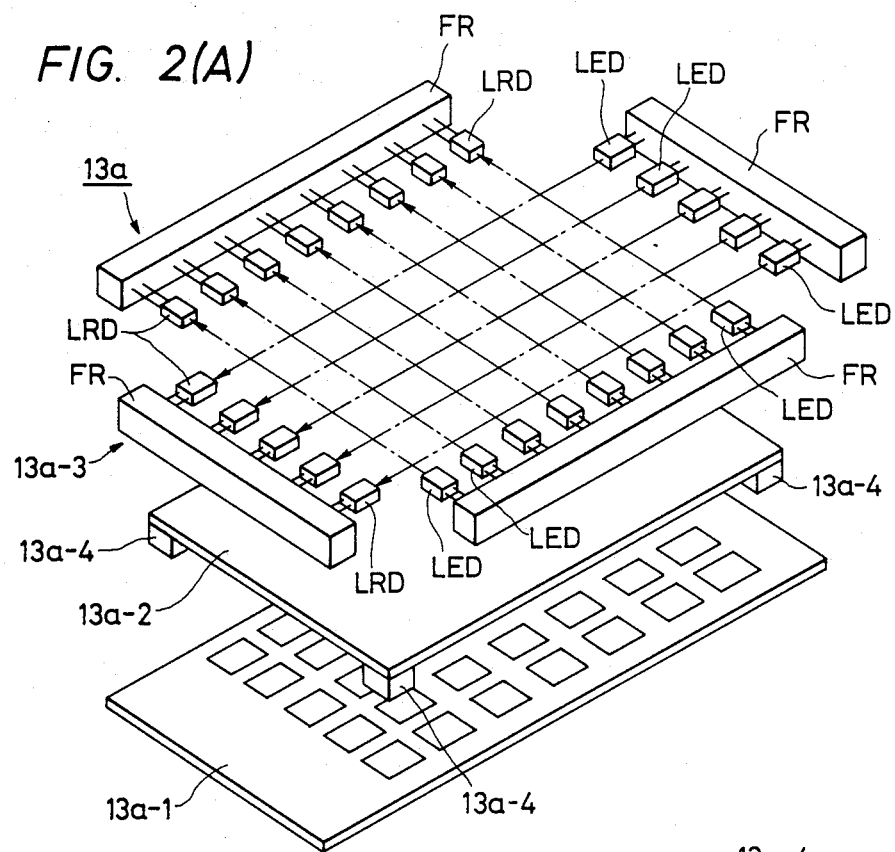
FIGS. 2 (A) and (B) are explanatory drawings of a touch panel as shown in FIG. 1, the former being an exploded perspective view and the latter being a perspective view.
Figure 2B:
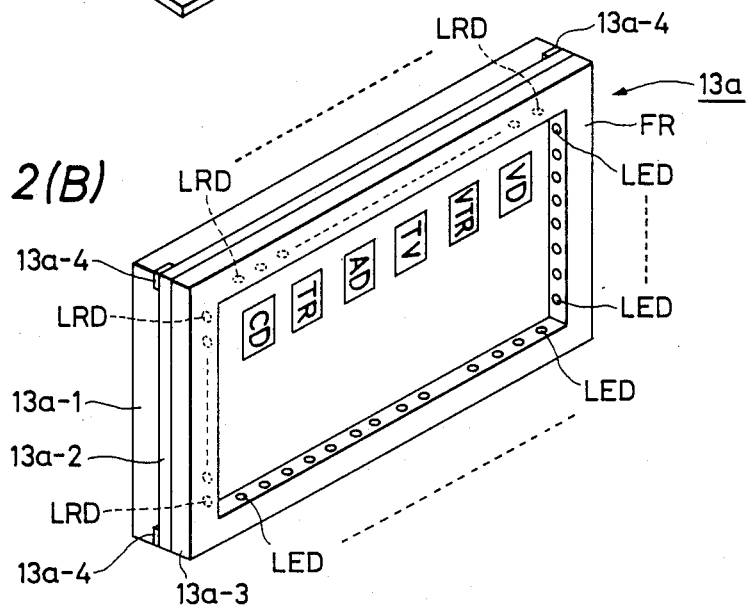
Figure 3A:
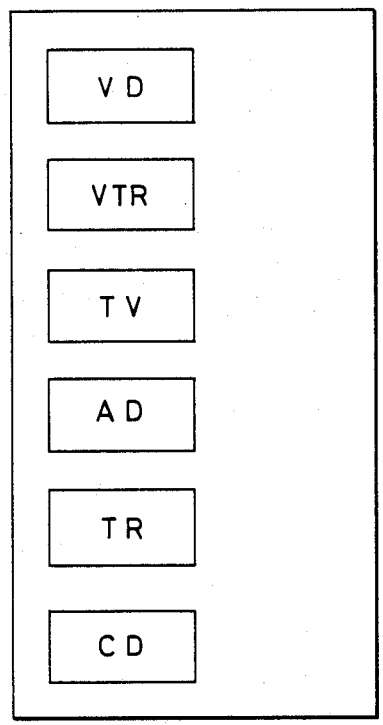
FIGS. 3 (A) and (B) are explanatory drawings of display examples, the former being a displayed image of a menu for selecting therefrom a device to be controlled and the latter being a displayed image for inputting an operating command to a VTR.
Figure 3B:
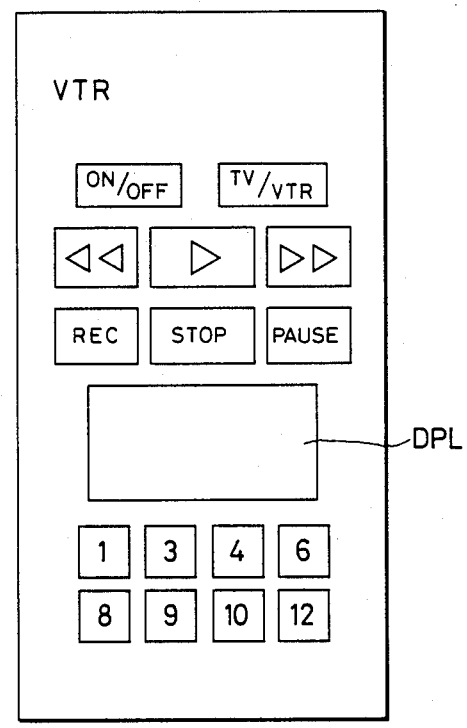

FIG. 1 is a block diagram of a system including a remote control apparatus of the invention, FIGS. 2 (A) and (B) are explanatory drawings of an operating portion in FIG. 1, the former being an exploded perspective view and the latter being a perspective view, and FIGS. 3 (A) and (B) are explanatory drawings of the displayed images.

Referring to FIG. 1, 1 denotes a remote control apparatus, 2a to 2n denote remote controlled devices such as TV, VTR, CD, ... , 3 denotes a control unit, which in response to an operating command signal delivered from the remote control apparatus 1 controls each of the controlled devices 2a–2n and also transmits an operation status signal of each of controlled devices to the remote control apparatus 1. The remote control apparatus 1 comprises a transmitting portion 11 for transmitting an operating command signal to the control unit 3, a receiving portion 12 for receiving the operation status signal indicating operation status of the controlled device, an operating portion 13 for inputting the operating command signal and also displaying operation status of the controlled device, and an image display control portion 14 for causing an image display device of the operating portion to make a display of an image for inputting a specific operating command signal and also a display corresponding to the status signal.

A transmission control circuit 11a of the transmitting portion 11 frequency-modulates (FM) the remote control command received from the operating portion 13 and drives, with the frequency-modulated signal, a transmitting device 11b formed of an infrared light emitting device or an ultrasonic vibrator.

A receiving device 12a (for example, a photodiode or supersonic vibrator) of a receiving portion 12 receives the status signal indicating operation status of the controlled devices 2a–2n delivered from the control unit 3 and supplies the same to a reception control circuit 12b, and the reception control circuit amplifies and demodulates the status signal and supplies the same to the image display control portion 14.

The operating portion 13 has a touch panel unit 13a for inputting an operating command, an operating command generating circuit 13b for generating a coded operating command according to the data indicating the kind of the image displayed on the touch panel unit (the data as to what device is to be controlled) and coordinates of the point on the surface of the panel which was pressed, and an enable circuit 13c in response to the press on the panel for putting the transmitting portion 11, receiving portion 12, and image display control portion 14 in an enabled state, i.e., a state capable of transmission, reception, and image displaying, for a predetermined period of time.

The touch panel unit 13a as shown in FIG. 2 has: (1) an image display device 13a-1 formed of an LCD (liquid crystal display) or the like for selectively displaying a predetermined image for inputting an operating command and also for displaying operation status of the controlled device on its display surface, (2) a translucent panel 13a-2 disposed in front of the display surface of the image display device, (3) an optical coordinate sensor 13a-3 for optically sensing coordinates of a specified point on the surface of the translucent panel, and (4) a pushbutton switch 13a-4 provided with a clicking property and actuated by a press on the translucent panel 13a-2. By the way, elements of the pushbutton switch 13a-4 are, for example, disposed at four corners under the translucent panel 13a-2 and adapted to be actuated (turned on) if any position on the translucent panel 13a-2 is depressed.

The optical coordinate sensor 13a-3 has a framework FR of the size corresponding to the circumference of the image display device 13a-1. Each pair of opposing sides of the framework are provided with a pair of arrays of a plurality of light emitting elements LED and a plurality of light-sensitive elements LRD, the former being disposed on one side and the latter disposed on the other side of the opposing sides. And the surface of the translucent panel 13a-2 is adapted to be scanned by the light emitting elements LED which are lighted one by one, first, in the direction of the X-axis, and then, in the direction of the Y-axis, whereby it is adapted such that X and Y corrdinates of a point on the surface of the translucent panel 13a-2 which was specified by a press with a fingertip or an indicating pen are sensed by the panel unit by detection of the position where the beams of light were shielded.

The control unit 3 has a controlling portion 3a, receiving portion 3b, and a transmitting portion 3c. The receiving portion 3b receives and demodulates a remote control command signal transmitted from the remote control apparatus 1 and inputs the remote control command encoded by the demodulation to the controlling portion 3a, the transmitting portion 3c demodulates a status signal indicating operation status of the controlled device input thereto by the controlling portion 3a and transmits the same to the remote control apparatus 1, and the controlling portion 3a reads the remote control command input thereto by the receiving portion 3b and inputs the remote control command to a specified one of the controlled devices 2a–2n, and receives an operation status signal of the device from an operation detecting portion included in the controlled device and encodes and inputs the operation status signal to the transmitting portion 3c.

Operations of the remote control apparatus according to the invention will be described in the following.

In starting a remote control operation, a predetermined position (a position for requesting a menu display) on the translucent panel 13a-2 of the touch panel unit 13a (FIG. 2) is first pressed.

When the translucent panel 13a-2 is pressed, any switch element of the pushbutton switch 13a-4 is turned on to enable the optical coordinate sensor 13a-3 to scan the coordinate area of the panel 13a-2 to detect an operating command selected by the user. Also, the enable circuit 13c is caused to generate an enable signal EBL, whereby the transmission control circuit 11a, reception control circuit 12b, and the image display control portion 14 are enabled, i.e., put in the state capable of transmission, reception, and image display, respectively, for a predetermined period of time. Upon being made capable of transmission, the transmission control circuit 11a requests the operating command generating circuit 13b to supply an operating command.

At the request for the operating command, the operating command generating circuit 13b detects the coordinates of the pressed point on the translucent panel 13a-2, checks if the values of the coordinates are in the region for requesting a menu display, and, if they are there, inputs a menu display requesting code to the transmission control circuit 11a. The transmission control circuit 11a, in turn, inputs the menu display requesting code to the image display control portion 14.

The image display control portion 14, upon receipt of the menu display requesting code, makes a display of the image of the menu for selecting a device from the controlled devices as shown in FIG. 3 (A) displayed on the image display device 13a-1. By the way, the state of the menu image on display is shown in FIG. 2 (B).

If then it is desired to remote control a video tape recorder (VTR), the surface of the translucent panel 13a-2 is pressed at the position where the characters "VTR" are indicated. Such an operation will hereinafter be described with the expression, "the operation key VTR is pressed", generally, even if another position than "VTR" is pressed.

By the press on the operation key VTR, the pushbutton switch 13a-4 is actuated, whereupon the transmission control circuit 11a again requests the operating command generating circuit 13b to generate an operating command. The operating command generating circuit 13b, in response to the request, inputs a coded signal corresponding to the operation key VTR to the transmission control circuit 11a, and the transmission control circuit 11a, in turn, inputs the coded signal to the image display control portion 14. The image display control portion 14, in response to the coded signal input thereto, makes a display of the image for inputting a remote control command for the VTR as shown in FIG. 3 (B).

Thereafter, if a specific key, the power key ON/OFF (the portion on the translucent panel where the characters "ON/OFF" are indicated), for example, is pressed, a code (command signal) specifying that the device to be controlled is a VTR and the operating command is turning on/off of the power is generated by the operating command generating circuit 13b.

The operating command is frequency-modulated in the transmission control circuit 11a and then transmitted from the transmitting device 11b to be received by the receiving portion 3b of the control unit 3. The receiving portion 3b demodulates the operating command signal received thereby and inputs a code signal obtained through the demodulation to the controlling portion 3a. The controlling portion 3a reads the code signal and finds out that the device to be controlled is a VTR and then inputs the code signal to the VTR 2b, whereby the VTR turns power on if it was off, or turns it off if it was on.

The fact that the power has been turned on or off (operation status) is immediately detected by a operation detecting portion (not shown) included in the controlled device and transmitted to the controlling portion 3a. The controlling portion 3a, in turn, encodes the status signal of the power and inputs the same to the transmitting portion 3c. By the way, it may be possible to structure the system without the operation detecting portion included. That is, considering the action in the controlled device to have been completed at the time point when the code signal has been input to the controlled device, the status signal may be directly input to the transmitting portion 3c at that time point.

The transmitting portion 3c frequency-modulates the operation status signal input thereto and transmits the same to the remote control apparatus 1. The receiving device 12a of the receiving portion 12 receives the operation status and supplies the same to the reception control circuit 12b. The reception control circuit 12b demodulates the operation status signal and inputs the same to the image display control portion 14.

The image display control portion 14, in response to the input operation status signal, makes a display to indicate that the power for the controlled device (VTR) is remote controlled by a reversed display of the characters "ON/OFF" on the image display device or underlining these characters "ON/OFF". The ways for displaying the operation status are not limited to the above mentioned reverse display and underlining. It may be possible, having the display region DPL (refer to FIG. 3 (B)) provided, to make the operation status displayed in this display region. It is also possible to arrange such that the position of the travel of the tape is displayed in the display region to indicate the completion of the operation that has been initiated by a reproducing key, fast-forward key, or a rewinding key.

Although the invention has been described in detail in the foregoing, it is apparent that the invention is not to be limited to the described embodiment but many modifications and variations of the invention are possible within the scope of the appended claims. For example, the invention can be applied to such a case where a very large number of keys are required for remote controlling a specific device, and therefore, the keys are divided into a plurality of groups and each group is provided with an image for inputting operating command, and the operating command is input according to the image to be displayed according to the need.

The remote control apparatus of the invention as described so far is constituted of: (1) the transmitting portion for transmitting an operating command signal to a controlled device; (2) the receiving portion for receiving a status signal indicating operation status of the controlled device; (3) the operating portion for inputting the mentioned operating command and, in response to the status signal received as above, for displaying the operation status of the controlled device; and (4) the image display control portion. And the mentioned operating portion is formed of: (a) the image display device for selectively displaying a predetermined image for inputting an operating command on its display surface and also displaying there the mentioned operation status; (b) the translucent panel disposed in front of the display surface of the image display device; (c) the optical coordinate sensor for optically sensing coordinates of a specified point on the surface of the translucent panel; and (d) the switch actuated by a press on the translucent panel for enabling the transmitting portion, receiving portion, and the image display control portion for a predetermined period of time. Since the apparatus is adapted such that the mentioned portions are enabled by a press on the specified position on the translucent panel and a specific operating command is input according to the image on display for inputting the operating command and the pressed position on the translucent panel, the need for providing the remote control apparatus with separate keys for the controlled devices is eliminated and therefore the remote control apparatus is prevented from becoming larger in size and yet the operation status displaying region need not be made smaller. Furthermore, since power supply to its portions is required only while these portions are put in an enabled state when they are rendered operable, saving of power consumption is attained.

What is claimed is:

1. A remote control apparatus for operating a controller for a controlled device, comprising:
   a transmitting portion for transmitting an operating command signal to the controller for the controlled device;
   a receiving portion for receiving a status signal provided by the controller indicating an operation status of the controlled device;
   an image display element, and an image display control portion; and
   an operating portion connected to said transmitting portion, receiving portion, and image display control portion for inputting an operating command, having said transmitting portion transmit the operating command to the controller for the controlled device, having said receiving portion receive a status signal from the controller confirming the operation status of the controlled device, and operating said image display control portion for displaying the operation status of the controlled device on said image display element,
   wherein said operating portion includes operation command inputting means formed by: a translucent panel disposed in front of a display surface of said image display element; an optical coordinate sensor arranged in front of said translucent panel for detecting a coordinate value of a point selected on the translucent panel in front of said image display element; and means, including a switch actuated by pressing said translucent panel, for enabling operation for a predetermined period of time of said image display control portion to provide a display of selectable operation commands on said image display element, said optical coordinate sensor being used to detect selection of a coordinate point corresponding to a selected operation command displayed on said image display element, and of said transmitting portion, receiving portion, and image display control portion to transmit the selected operation command, receive the status signal, and display the operation status of the controlled device, whereby a power supply to said remote control apparatus is required only while the above-mentioned portions are in the enabled state for said predetermined period of time, thereby allowing a saving of power consumption to be obtained.

2. A remote control apparatus according to claim 1, adapted to control the controller which is connected to a plurality of controlled devices, wherein said operation command inputting means includes means for effecting a device menu display of selectable controlled devices, and means for effecting a command menu display for a selected controlled device in response to selection of one controlled device from said device display menu.

3. A remote control apparatus according to claim 1, wherein said operation command inputting means includes an enable circuit for generating an enable signal to enable operation of said transmitting portion, receiving portion, and image display control portion for said predetermined period of time upon actuation of said switch until the desired operations of said portions are completed.

* * * * *